US012772598B2

(12) United States Patent
Gisler

(10) Patent No.: US 12,772,598 B2
(45) Date of Patent: Oct. 20, 2026

(54) METHOD AND DEVICE FOR WIRING PHOTOVOLTAIC CELLS

(71) Applicant: Megasol Energie AG, Deitingen (CH)

(72) Inventor: Markus Gisler, Wangen an der Aare (CH)

(73) Assignee: Megasol Energie AG, Deitingen (CH)

( * ) Notice: Subject to any disclaimer, the term of this patent is extended or adjusted under 35 U.S.C. 154(b) by 60 days.

(21) Appl. No.: 18/572,771

(22) PCT Filed: Jul. 22, 2022

(86) PCT No.: PCT/EP2022/070712
§ 371 (c)(1),
(2) Date: Dec. 20, 2023

(87) PCT Pub. No.: WO2023/006632
PCT Pub. Date: Feb. 2, 2023

(65) Prior Publication Data

US 2024/0290906 A1 Aug. 29, 2024

(30) Foreign Application Priority Data

Jul. 30, 2021 (CH) ................................ 70114/2021
Nov. 5, 2021 (CH) ................................ 70511/2021
Feb. 24, 2022 (CH) .................................... 184/2022

(51) Int. Cl.
*H10F 71/00* (2025.01)
*B23P 19/04* (2006.01)
*H10F 19/90* (2025.01)

(52) U.S. Cl.
CPC .......... *H10F 71/1375* (2025.01); *B23P 19/04* (2013.01); *H10F 19/902* (2025.01)

(58) Field of Classification Search
CPC ..... H05K 3/10; H10F 19/908; H10F 71/1375; H10F 77/219; H10F 19/902; H10F 19/80; H10F 19/904; H10F 71/00; H10F 77/937; H10F 19/906; H10F 77/211; H10F 10/17; H10F 10/172; H10F 19/10; H10F 19/30; H10F 19/70; H10F 19/804; H10F 19/85; H10F 71/128; H10F 71/131; H10F 77/169; H10F 77/1692; H10F 77/1694; H10F 77/215; H10F 77/48; H10F 77/707; H10F 77/93; H10F 10/163; H10F 19/00;
(Continued)

(56) References Cited

U.S. PATENT DOCUMENTS

2012/0279546 A1* 11/2012 Kutzer .................. H10F 19/908
136/244
2020/0098943 A1* 3/2020 Terashita .............. H10F 10/146

FOREIGN PATENT DOCUMENTS

DE 102006007447 A1 7/2007
EP 3200240 A1 8/2017
JP 2004200427 A * 7/2004

OTHER PUBLICATIONS

Written Opinion of the International Search Authority for PCT/EP2022/070712 mailed Nov. 8, 2022, pp. 1-10.

* cited by examiner

*Primary Examiner* — Edward Chin
(74) *Attorney, Agent, or Firm* — GrowIP Law Group LLC

(57) ABSTRACT

The present disclosure relates to a method and a device for wiring photovoltaic cells into a string of photovoltaic cells, as well as a module comprising a string of photo voltaic cells. The photovoltaic cells are typically arranged in a first direction and are electrically interconnected by elongated wiring elements on their respective back faces in series.

8 Claims, 9 Drawing Sheets

(58) Field of Classification Search
CPC ........ H10F 19/90; H10F 77/20; H10F 77/939; H02S 40/22; H02S 40/34; H02S 30/10; H02S 30/20
See application file for complete search history.

METHOD AND DEVICE FOR WIRING PHOTOVOLTAIC CELLS

CROSS-REFERENCE TO RELATED APPLICATIONS

This application is a U.S. National Stage Application that claims the benefit of the filing date of International PCT Application No. PCT/EP2022/070712, filed on Jul. 22, 2022, that claims priority to (i) Swiss Application No. CH070114/2021, filed on Jul. 30, 2021, (ii) Swiss Application No. CH070511/2021, filed on Nov. 5, 2021, and (iii) Swiss Application No. CH000184/2022, filed on Feb. 24, 2022, each of which are hereby incorporated by reference in their entirety.

FIELD OF THE DISCLOSURE

The present disclosure relates to a method and a device for wiring photovoltaic cells into a string of photovoltaic cells, as well as a module comprising at least one string of photovoltaic cells.

BACKGROUND OF THE DISCLOSURE

Photovoltaic cells having back side contacts have their electrodes on the back face i.e. the side opposite the side which faces primarily the sun. This type of photovoltaic cells provides a superior efficiency in comparison to regular photovoltaic having their electrodes on the front and on the back face. This is due to wiring elements needed for electrically interconnecting the cells within a module partially obscuring the surface of the photovoltaic cells front face receiving sun light/radiation. With back side contact cells, no wiring elements are obscuring the front face providing a greater surface to receive light.

However, the electrical interconnection of multiple back face contact cells in series into a string is not trivial and should be done in an efficient manner in order to mass produce photovoltaic modules including these strings of photovoltaic cells.

Some attempts are known from the prior art, discussed briefly hereinafter.

EP3142156A1 published in March 2017 in the name of LG Electronics INC relates to a solar cell module and a method for manufacturing the same. The solar cell module includes a plurality of solar cells each including a semiconductor substrate and first and second electrodes, each of which has a different polarity and is extended in a first direction on a back surface of the semiconductor substrate, and a plurality of conductive lines extended in a second direction crossing the first direction on the back surface of the semiconductor substrate, connected to one of the first and second electrodes through a conductive adhesive, and insulated from the other electrode by an insulating layer. The conductive adhesive includes a first adhesive layer connected to the one electrode and a second adhesive layer positioned on the first adhesive layer and connected to the plurality of conductive lines.

WO2020069419A1 published in April 2020 in the name of Sunpower Corporation relates a photovoltaic (PV) string including a solar cell with a wrap-around metal contact finger. A method of coupling an electrically conductive connector to a solar cell with a wrap-around metal contact finger. In addition, it related to a solar cell including a first plurality of metal contact fingers, and a second plurality of metal contact fingers interdigitated with the first plurality of metal contact fingers, wherein at least one of the first plurality of metal contact fingers comprises a wrap-around metal finger that passes between a first edge of the solar cell and at least one contact pads.

SUMMARY OF THE DISCLOSURE

As mentioned above, photovoltaic cells having back face contacts have a superior efficiency in converting light into electricity. In addition, modules comprising this type of photovoltaic cells are aesthetically more pleasing, as the wiring elements are typically not visible, snice they are arranged on the back side of the module and therefore not visible on the front side of the module. However, the electrical interconnection of the photovoltaic cells within a module should be in an efficient manner and ideally the complexity of the production method and the device therefore should be kept to a minimum.

To achieve this, a first aspect of the disclosure is directed to a method for wiring photovoltaic cells to a string of electrically interconnected photovoltaic cells. The method comprises the step of arranging next to each other in a first direction a first, a second and a third photovoltaic cell on a platform. The second photovoltaic cell is arranged between the first and the third photovoltaic cell in a rotated orientation with respect to the first and the third photovoltaic cell. Usually the rotation is with respect to a vertical axis of rotation. Meaning the first, the second and the third photovoltaic cell on the platform are each arranged with the back face facing upward or alternatively each facing downward.

Typically, the photovoltaic cells are arranged with their optically active surface next to each other. The optically active surface refers to the surface of a photovoltaic cell which is capable to receive (sun) light/radiation and at least partially convert the light into electricity.

Good results are possible when arranging two photovoltaic cells next to each other with an overlap in the first direction, the overlap being preferably in an optically inactive region of the two photovoltaic cells. In some variations, the overlap can be between 0.1 and 0.6 millimeters, preferably around 0.3 millimeters, however depending on the cells the overlap may be adapted. Arranging the photovoltaic cells with an overlap is advantageous, as the string of photovoltaic cells can be shortened in the first direction, while having essentially the same optically surface.

Usually the method further comprises the steps of electrically interconnecting the first photovoltaic cell and the second photovoltaic cell on their respective back faces in series by at least one elongated wiring element in the first direction in a first lateral position. And electrically interconnecting the second photovoltaic cell and the third photovoltaic cell on their respective back faces in series by at least one elongated wiring element in the first direction in a second lateral position.

When electrically interconnecting photovoltaic cells arranged with an overlap next to each other in the first direction, the elongated wiring elements are typically not visible on a front face of the string. This allows to manufacture aesthetically more pleasing modules, as light reflections by the elongated wiring elements are reduced and the modules appear more uniform.

To achieve the desired efficiency in wiring the photovoltaic cells, the first and the second lateral positions are off-set with respect to each other perpendicular to the first direction. This allows an essentially straight crossover of the respective at least one elongated wiring element between two neighboring photovoltaic cells.

Usually the first, the second and the third photovoltaic cell are plate-shaped, each comprising a first edge and a second edge opposite to the first edge, wherein the cells are arranged in the first direction next to each other along their first and respectively second edges. In this context the rotated orientation of the second photovoltaic cell can be understood in that the first edge of the second photovoltaic cell faces the first edge of the third photovoltaic cell and the second edge of the second photovoltaic cell faces the second edge of the first photovoltaic cell. When the photovoltaic cells are arranged next to each other with an overlap, the edges of the photovoltaic in the area of the overlap are preferably parallel.

The overlap of the first photovoltaic cell and the second photovoltaic cell can have a same overlap stacking order as the overlap of the second photovoltaic cell and the third photovoltaic cell. This can be described as a scale-like overlap. However, the second photovoltaic cell may overlap with the first and the third photovoltaic cell in the same manner. This can be described as a brick-wall-like overlap.

In order to manufacture strings of photovoltaic cells of a desired length, the method preferably comprises the steps of arranging a first subsequent photovoltaic cell on the platform in the first direction next to a photovoltaic cell momentarily tailing the string and electrically interconnecting the first subsequent photovoltaic cell and the photovoltaic cell momentarily tailing the string on their respective back faces in series by at least one elongated wiring element in the first direction in the first lateral position. Alternatively, or in addition, arranging a second subsequent photovoltaic cell on the platform in the first direction next to a photovoltaic cell momentarily tailing the string and electrically interconnecting the second subsequent photovoltaic cell and the photovoltaic cell momentarily tailing the string on their respective back faces in series by at least one elongated wiring element in the first direction in the second lateral position. These steps can be understood as extending an intermediate string arranged on the platform by a first or a second subsequent photovoltaic cell.

Preferably the first and/or the second subsequent photovoltaic cell are respectively arranged with a rotated orientation next to the photovoltaic cell momentarily tailing the string, such that at least one main conductor path of the first or the second subsequent photovoltaic cell is aligned in the first direction with a main conductor path of opposite polarity of the photovoltaic cell momentarily tailing the string.

Depending on the field of application the step of extending the string by a first and a second subsequent photovoltaic cell are performed in an alternating manner until the desired number of photovoltaic cells are electrically interconnected in series, to form a string of the desired length (i.e. number of cells).

For good results the method comprises the step of depositing in the first lateral position at least one elongated wiring element in the first direction for electrically interconnecting the first subsequent photovoltaic cell and the photovoltaic cell momentarily tailing the string on their respective back faces in series. In addition, the method may comprise the step of depositing in the second lateral position at least one elongated wiring element in the first direction for electrically interconnecting the second photovoltaic cell and the photovoltaic cell momentarily tailing the string on their respective back faces in series. In other words, the method comprises depositing at least one elongated wiring element in the first direction in the first or in the second lateral position onto the platform.

During manufacturing of the strings, the photovoltaic cells can be arranged on the platform and afterwards the elongated wiring elements are deposited thereon. Alternatively, or in addition, the elongates wiring elements can be deposited on the platform and afterwards at least one photovoltaic cell can be arranged on the platform already carrying at least one elongated wiring element.

Depending on the implementation the at least one elongated wiring element is drawn by a depositing means in the first direction from a feeding means, said depositing means are thereby moving relative to the platform. Depending on the de-sign the feeding means comprises several feeders configured to provide a wiring material from one supply per feeder to the depositing means. The feeding means my also comprise separating means configured to cut the quasi-continuous wiring material to length.

The depositing means may alternatingly draw at least one elongated wiring element for depositing it in the first or in the second lateral position, however the depositing means may also draw at least two elongated wiring element simultaneously for depositing on in in the first lateral position and the other in the second lateral position.

In some variations the method comprises gripping by at least one first gripper arranged in the first lateral position on a first gripper arm at least one elongated wiring element for depositing the at least one elongated wiring element in the first lateral position. In addition, the method may comprise gripping by at least a second gripper arranged in the second lateral position on the first gripper arm or a separate second gripper arm at least one elongated wiring element for depositing the at least one elongated wiring element in the second lateral position.

Alternatively, the at least one first gripper acts as the at least one second gripper by switching between the first to the second lateral position. In this case there is only one gripper arm needed, however additional gripper arms are possible in order to increase the manufacturing speed.

For good performance the at least one elongated wiring element is cut during depositing to a length of less than two photovoltaic cells in the first direction arranged next to each other in the first direction, in particular to a length of more than an individual photovoltaic cell. This makes the cutting of redundant crossovers of elongated wiring elements between photovoltaic cells, as shown in the prior art obsolete. This is due to the elongated wiring elements have already the required length once deposited.

Depending on the field of application, only a first and a second photovoltaic cell are arranged on the platform. Here the third photovoltaic cell is omitted (or at least initially). In this case the method comprises the steps of electrically contacting the first photovoltaic cell by at least one elongated wiring element in the first direction in the second lateral position. The at least one elongated wiring element usually extends in the first direction beyond the first photovoltaic cell to be electrically interconnected to at least one end contact conductor or the like. Here the method further comprises the steps of electrically interconnecting the first photovoltaic cell and the second photovoltaic cell on their respective back faces in series by at least one elongated wiring element in the first direction in the first lateral position.

Depending on the application, at least one of the photovoltaic cells may comprise multiple separate parts. Good results are possible when at least one of the photovoltaic cells, in particular the first and/or the second and/or the third photovoltaic cell, comprises two separate half-cells which are arranged next to each other in the first direction. Each half-cell typically has a lower extension in the first direction than in the second direction, in particular about half the length of a full photovoltaic cell in the first direction and a similar width in the second direction compared to a full photovoltaic cell.

Especially when thermally soldering the elongated wiring element onto the respective back face, photovoltaic cells tend to bend, in particular upward from the platform. This deformation can be minimized by shortening a continuous extension of the photovoltaic cell in the first direction, as each half-cell bends less than a full photovoltaic cell. The two separate half-cells preferably form pair, such that the method described above can be applied with no or only minimal adjustments, as a pair of half-cells can be treated as a unit/one photovoltaic cell. In a preferred variation, the first, a second and a third photovoltaic cell, as well as the first and second subsequent photovoltaic cells are respectively formed as a pair of half-cells. Typically, a pair of half-cells is created by dividing a full photovoltaic cell essentially perpendicular to its main conductor paths into two separate half-cells.

Similarly, as described before for full photovoltaic cells, each pair of half-cells can be arranged on the platform in an overlapping, adjacent or gapped manner.

A second aspect of the disclosure is directed to a device for wiring photovoltaic cells having back face main conductor paths to a string of photovoltaic cells. The device usually comprises a platform configured for carrying at least a first, a second and a third photovoltaic cell arranged thereon next to each other in a first direction. An applicator for applying elongated wiring elements to photovoltaic cells is typically arranged next to and/or above the platform. The applicator usually comprises a feeding means being arranged to feed elongated wiring elements from at least one supply to a depositing means. The platform and said depositing means being configured to be moved in the first direction relatively to each other. For wiring the photovoltaic cells, the depositing means is configured to deposit in a first lateral position at least one elongated wiring element from the feeding means in the first direction for electrically interconnecting a first photovoltaic cell and a second photovoltaic cell arranged next to each other in the first direction on their back faces.

In addition, the depositing means is configured to deposit in a second lateral position at least one elongated wiring element from the feeding means in the first direction for electrically interconnecting the second photovoltaic cell and a third photovoltaic cell arranged next to each other in the first direction on their back faces in series.

The first and the second lateral positions are preferably off-set with respect to each other perpendicular to the first direction.

This allows the electrical interconnection of multiple photovoltaic cells in the first direction by essentially straight and parallel elongated wiring elements. Depending on the application the depositing means is configured to deposit multiple elongated wiring elements in the first and/or lateral position essentially simultaneously. The at least one elongated wiring element in the first lateral position interconnecting the first and the second photovoltaic cell is preferably partially off-set with the elongated wiring element interconnecting the second and the third photovoltaic cell in the second lateral position.

To achieve good results a supply arrangement is configured to arrange subsequent photovoltaic cells on the platform, such that an orientation of the subsequent photovoltaic cell is turned with respect to the photovoltaic cell momentarily tailing the string. As described before, this allows the arrangement of subsequent photovoltaic cell for extending the string, wherein every second photovoltaic cell is arranged on the platform in a turned orientation.

The feeding means for feeding elongated wiring elements is preferably arranged next to the platform, in particular next to an end of the platform in the first direction. This allows the platform to move the photovoltaic cells of the string already electrically interconnected in series in the first direction away from the feeding means. Here the subsequent photovoltaic cells for extending the string are typically arranged on the platform next to the feeding means, since the distance for the depositing means to draw the at least one elongated wiring element from the feeding means is minimized.

In a preferred variation the depositing means comprises at least a first gripper and at least a second gripper being arranged laterally off-set and being configured to deposit an elongated wiring element in the first lateral position and respectively in the second lateral position. Typically, the at least one first gripper is arranged in the first lateral position and the at least one second gripper is arranged in the second lateral position. However, the at least one first gripper may act as the at least one second gripper by switching between the first and the second lateral position. The at least one first and the at least one second gripper are each configured to grip and release an elongated wiring element, in particular by closing and opening the respective gripper. Usually the at least one first and the at least one second gripper grip the respective elongated wiring element by an end section of the elongated wiring element, which may protrude from the feeding means.

Preferably the depositing means comprises a gripper arm extending essentially perpendicular to the first direction in a lateral direction and having a group of first grippers and a group of second grippers attached thereto in an alternating manner in the second direction. The gripper is usually arranged movable above the platform.

Alternatively, the depositing means may comprise a first and a second gripper arm, each extending essentially perpendicular to the first direction in a second direction. In this case the first gripper arm typically has a group of first grippers attached thereto spaced apart a certain distance in the latera direction from one another and the second gripper arm having a group of second grippers attached thereto spaced apart a certain distance in the lateral direction from one another. Here, the first grippers are each arranged in a first lateral position usually alternating in the lateral direction with a second gripper each being arranged respectively in a second lateral position.

In a preferred variation the platform comprises a conveying means e.g. a conveyor belt configured for transporting photovoltaic cells arranged thereon in the first direction.

For good performance the device comprises a control unit communicatively interconnected to the depositing means for controlling the depositing of the elongated wiring elements. Preferably the control unit is configured to control the movement of the at least one gripper arm in the first direction. Typically, the control unit is further configured to control the at least one first and the at least one second gripper, in particular in gripping and releasing elongated wiring elements. In some variations the control unit is communicatively interconnected to the platform, in particular to the conveying means, for controlling the advancement of the photovoltaic cells arranged on the platform.

The previously described embodiments of the method for wiring photovoltaic cells to a string disclose at the same time correspondingly designed embodiments of the device and vice versa. The described embodiments of the device can serve to carry out the method according to the disclosure.

A third aspect of the disclosure is directed to a photovoltaic module comprising a string of photovoltaic cells extending in a first direction. The string usually comprises at least a first, a second and a third plate-shaped photovoltaic cell arranged next to each other in the first direction.

These cells are in general arranged between a front and back sheet. Typically, a fixed connection of the layers of front sheet, the string or strings of photovoltaic cells and the back sheet by at least one intermediate layer of polymers such as EVA (ethylene-vinyl acetate) e.g. by means of lamination.

In a preferred variation each photovoltaic cell comprises at least one positive main conductor path and at least one negative main conductor path, respectively spanning essentially parallel in the first direction across a back face of the respective photovoltaic cell. Typically, the at least one positive main conductor path being connected to p-type semiconductor regions by several positive contact finger and said at least one negative main conductor path being connected to n-type semiconductor regions by several negative contact finger interdigitated with the several positive contact fingers. The at least one positive and the at least one negative main conductor paths can be seen as electrical poles of the respective photovoltaic cell.

For an efficient electrical interconnection, the second photovoltaic cell is arranged between the first and the third photovoltaic cell in a rotated orientation with respect to the first and the third photovoltaic cell, such that the main conductor paths of the second photovoltaic cell align with main conductor paths of opposite polarity of the first and third photovoltaic cell. At least one elongated wiring element electrically interconnects the first photovoltaic cell and the second photovoltaic cell in a first lateral position on their respective back faces in series. In addition, at least one elongated wiring element electrically interconnecting the second photovoltaic cell and the third photovoltaic cell in a second lateral position on their respective back faces in series. This way the positive main conductor paths of a photovoltaic cell can be electrically interconnected with the negative main conductor paths (or vice versa) of a proceeding or subsequent photovoltaic cell.

Depending on the field of application the at least one sting comprises only a first and a second photovoltaic cell, the third photovoltaic cell being omitted. This is typically the case in narrow photovoltaic modules e.g. for the use as roof tiles.

In a preferred variation, the string comprises a multiplicity of photovoltaic cells wherein every second photovoltaic cell in the first direction being rotated by 180 degrees, in particular about a vertical axis of rotation. Good results can be achieved when every second photovoltaic cell in the first direction is interconnected to the preceding photovoltaic cell of the string by at least one elongated wiring element in the first lateral position and to the subsequent photovoltaic cell of the string by at least one elongated wiring element in the second lateral position, or vice versa.

In order to allow an efficient electrical interconnection of every second rotated photovoltaic cell within the string, the at least one positive main conductor path and the at least one negative main conductor path are arranged symmetrical with respect to rotation of the respective photovoltaic cell, in particular by 180 degrees about a vertical axis of rotation. This allows an essentially straight crossover of the elongated wiring element electrically interconnecting the photovoltaic cells of the string in series.

In case a module comprises more than one string of photovoltaic cells arranged next to each other, in particular essentially parallel in the first direction, said strings are usually electrically interconnected in series by end contact conductors arranged next to an end and/or a start of each string. Typically, in order to electrically interconnect two neighboring strings, one end contact conductor may extend along the end of one string and the beginning of the neighboring string. Preferably the end contact conductors are electrically interconnected to the photovoltaic cell heading respectively trailing a string by elongated wiring elements.

Depending on the field of application, elongated wiring elements have an essentially circular or rectangular cross-section. The elongated wiring elements can be at least one out of the following: a ribbon, in particular a tin plated copper ribbon, a wire, a fabric, preferably a woven fabric comprising electrically conductive and isolating filaments.

In some variations the elongated wiring elements comprise adhesives, in particular electrically conductive adhesives for fixedly connecting the elongated wiring element to a photovoltaic cell. In other variations the elongated wiring element are configured to be soldered to a photovoltaic cell. In some other variations an adhesive film or substrate or tape is used to fixate the position of the elongated elements on the back face of the respective photovoltaic cell. In this case it is possible to achieve a good electrical connection between the at least one elongated wiring element and the respective photovoltaic cells during the subsequent lamination, in particular using low temperature soldering agents.

It is to be understood that both the foregoing general description and the following detailed description present embodiments, and are intended to provide an overview or framework for understanding the nature and character of the disclosure. The accompanying drawings are included to provide a further understanding, and are incorporated into and constitute a part of this specification. The drawings illustrate various embodiments, and together with the description serve to explain the principles and operation of the concepts disclosed.

BRIEF DESCRIPTION OF THE DRAWINGS

The herein described disclosure will be more fully understood from the detailed description given herein below and the accompanying drawings which should not be considered limiting to the disclosure described in the appended claims. The drawings are showing:

Figures 2A, 2B, 3:
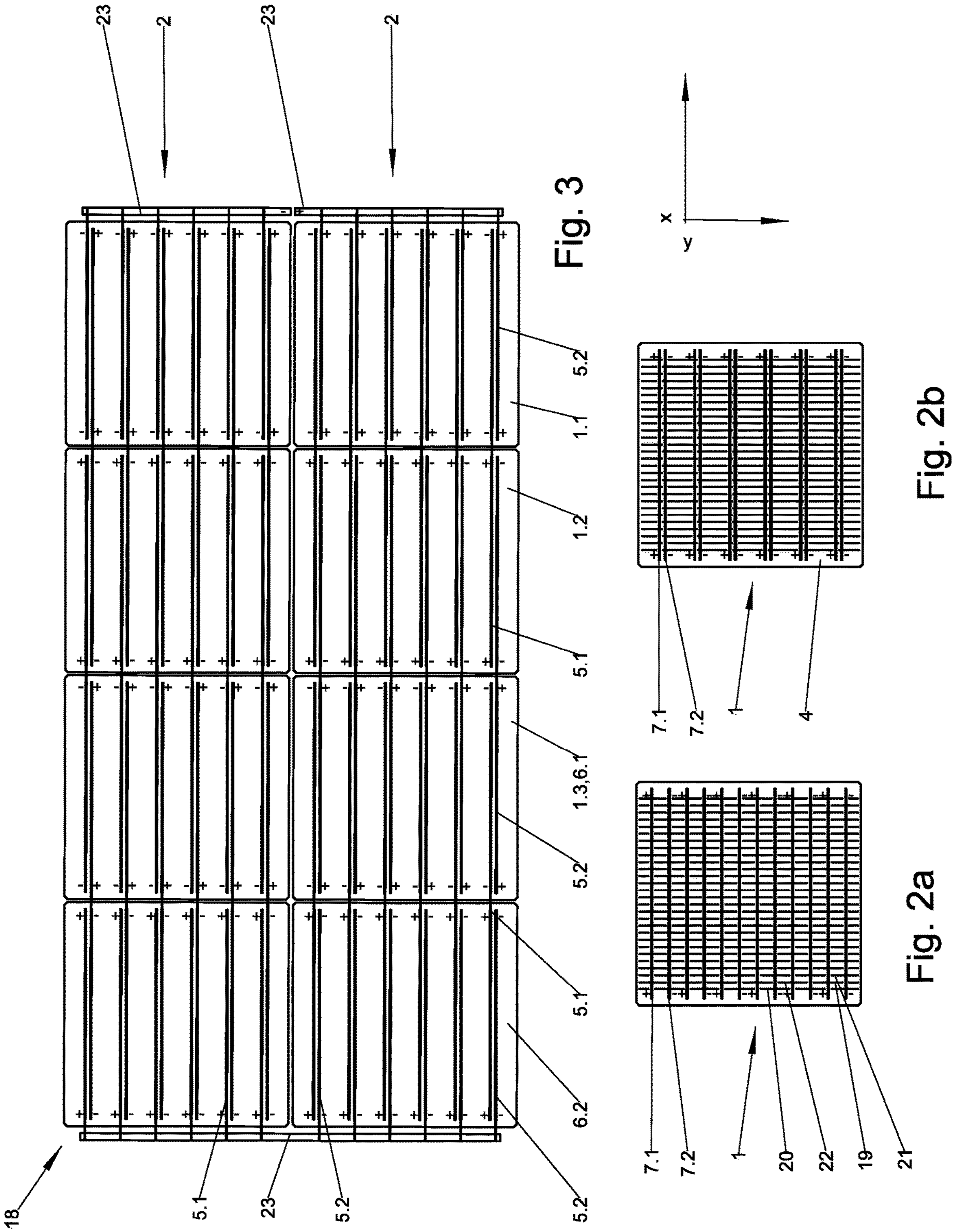
FIG. 2 a) a first variation of a photovoltaic cell having back face main conductor paths.
Figure 4:
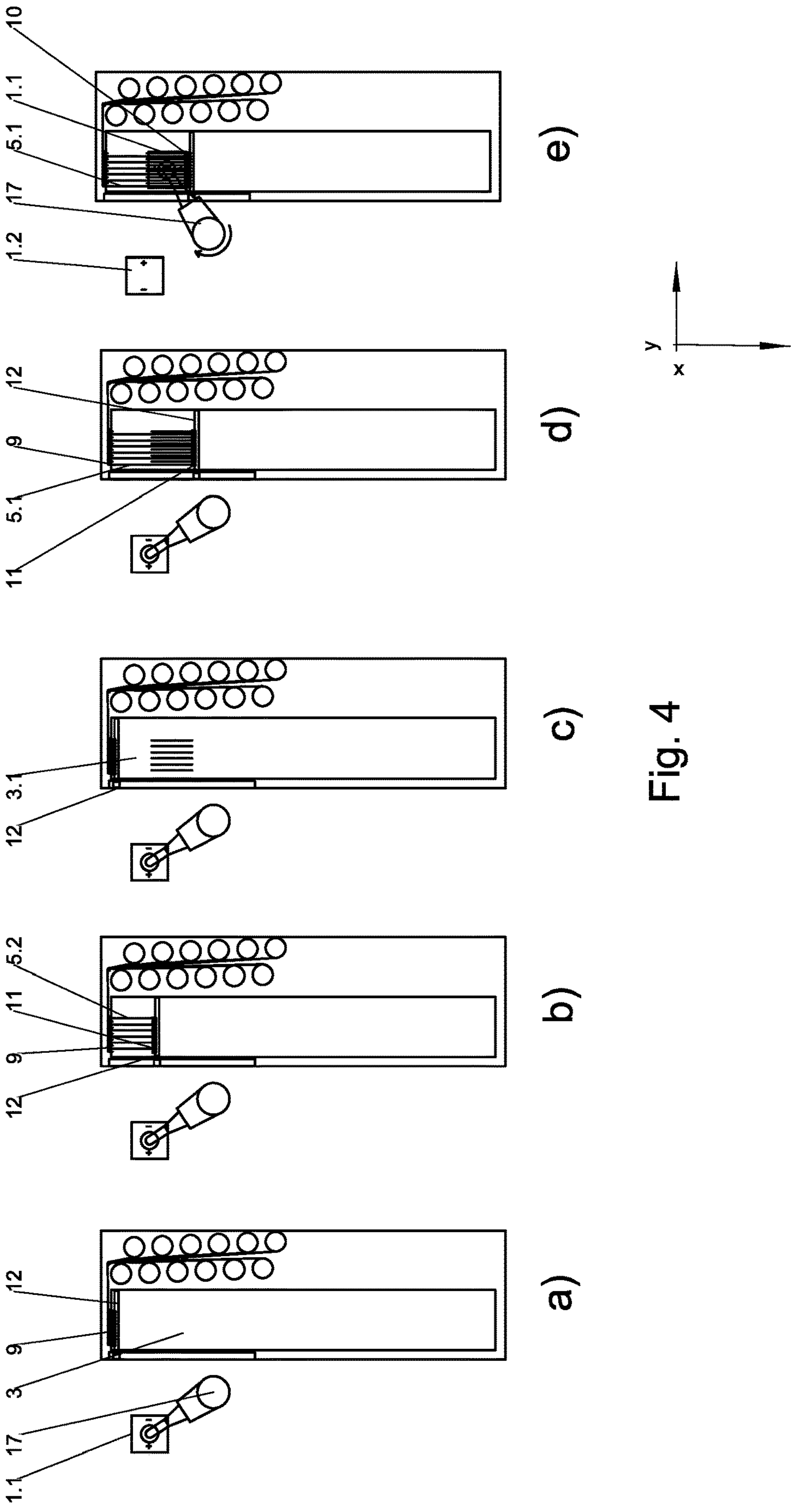
Figure 5:
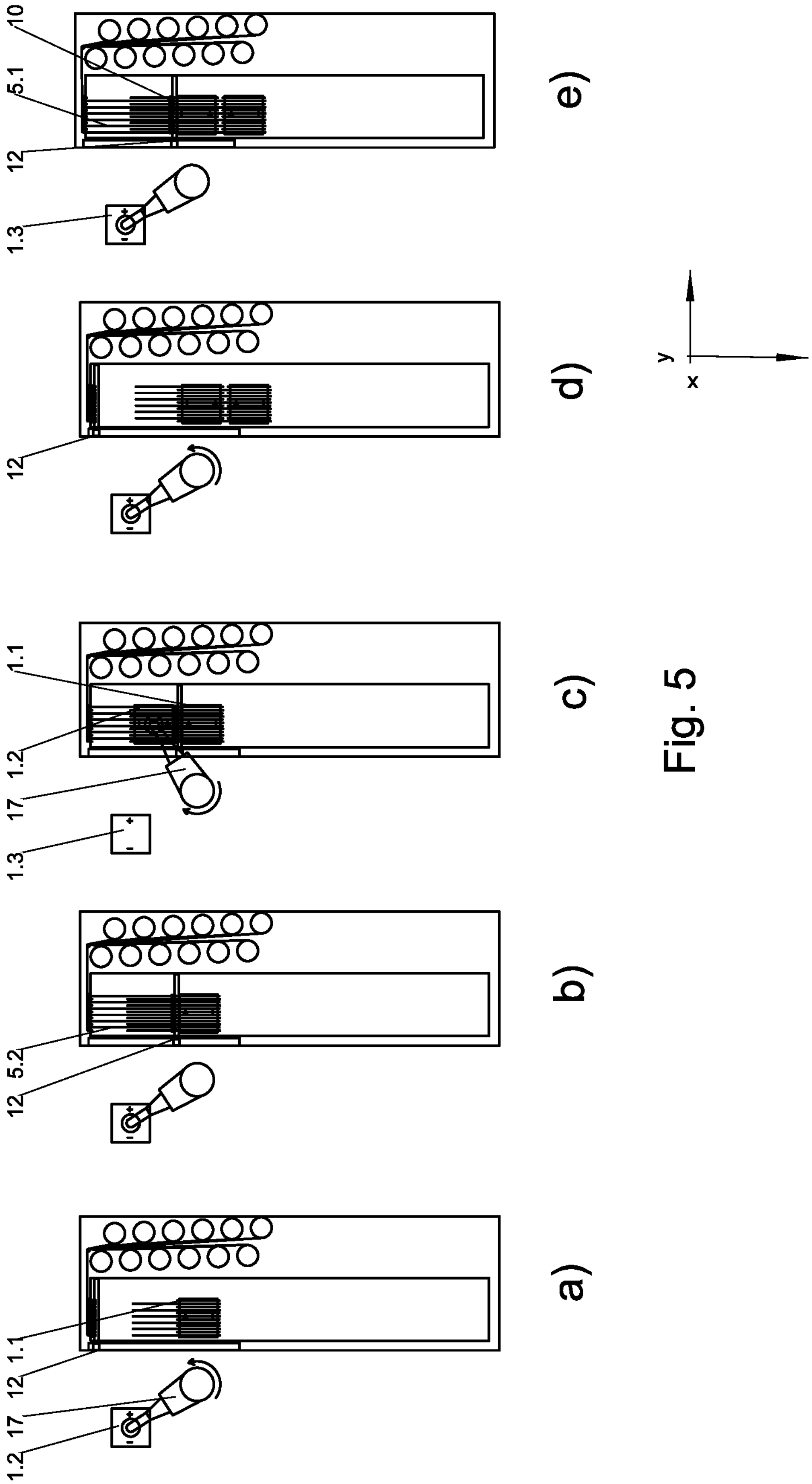
Figure 6:
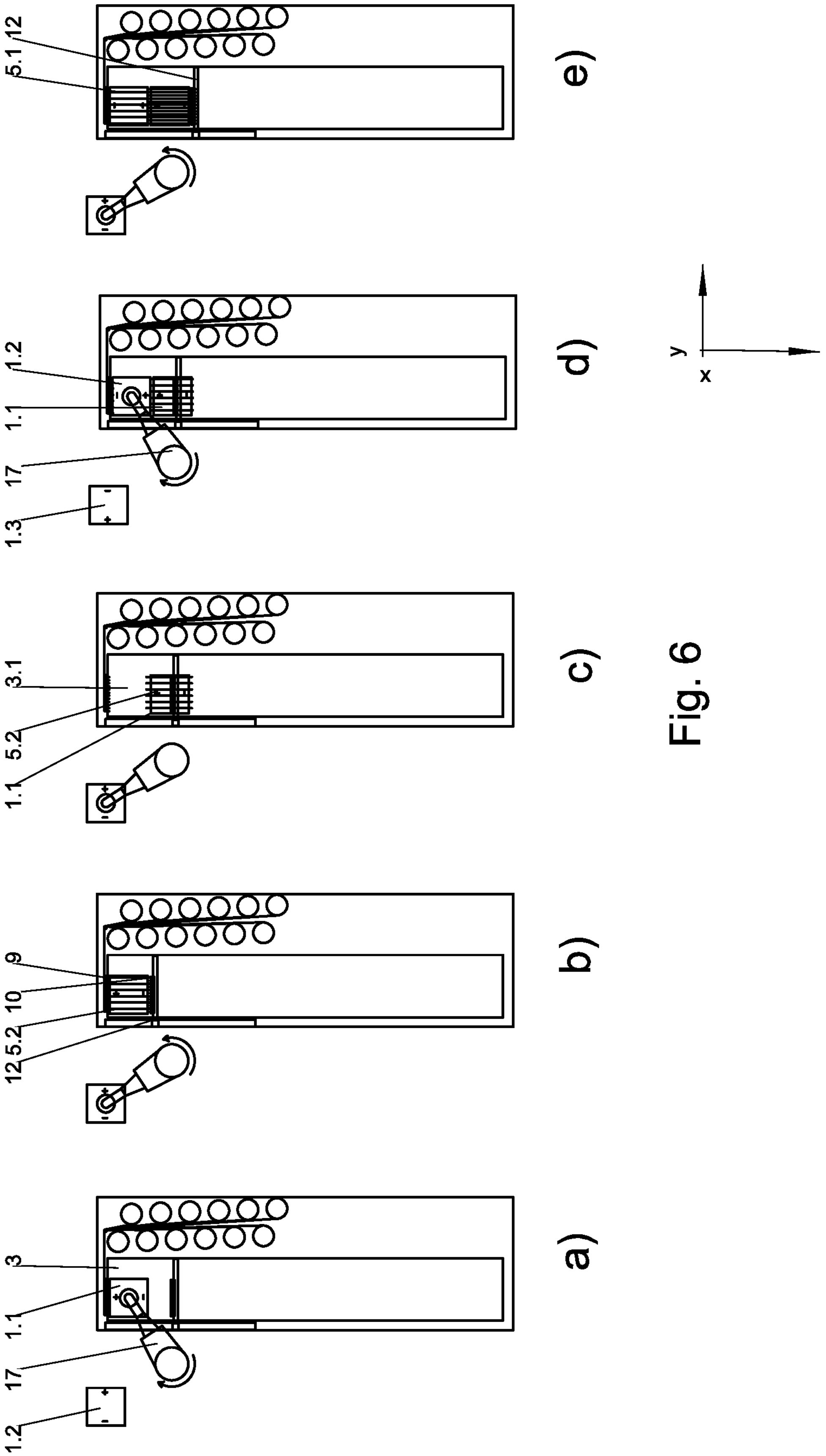
Figure 7:
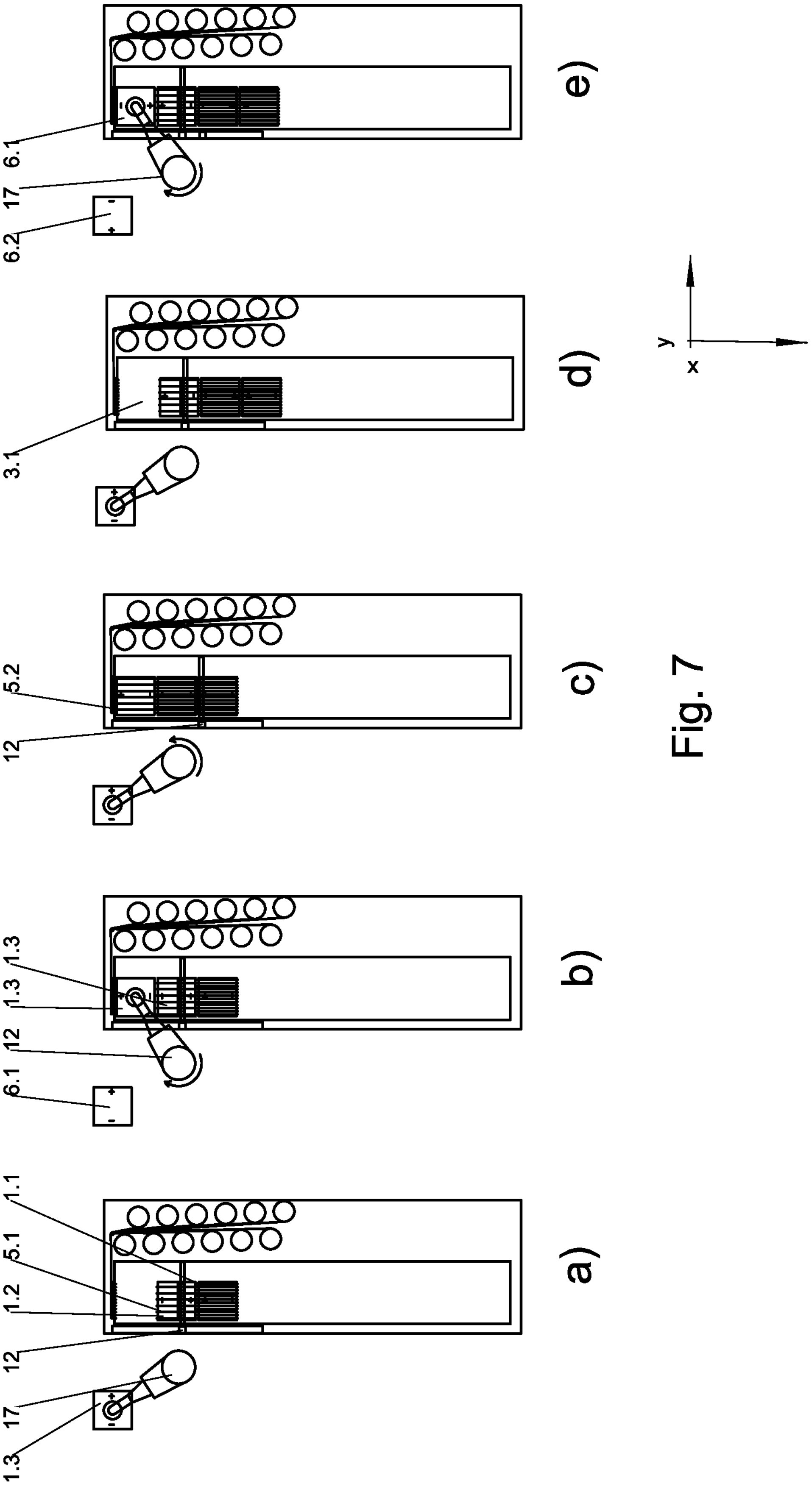
Figure 8:
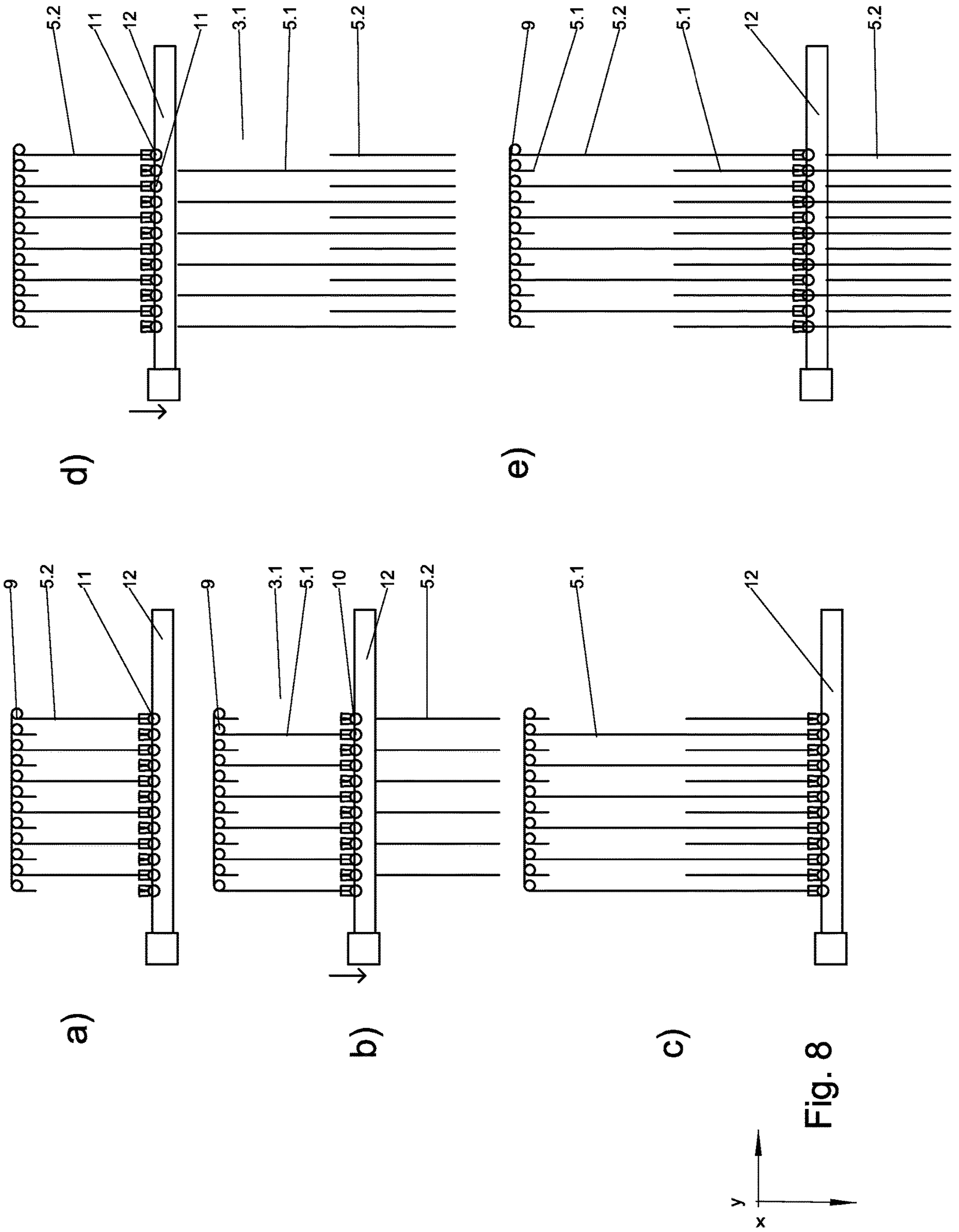
Figure 9:
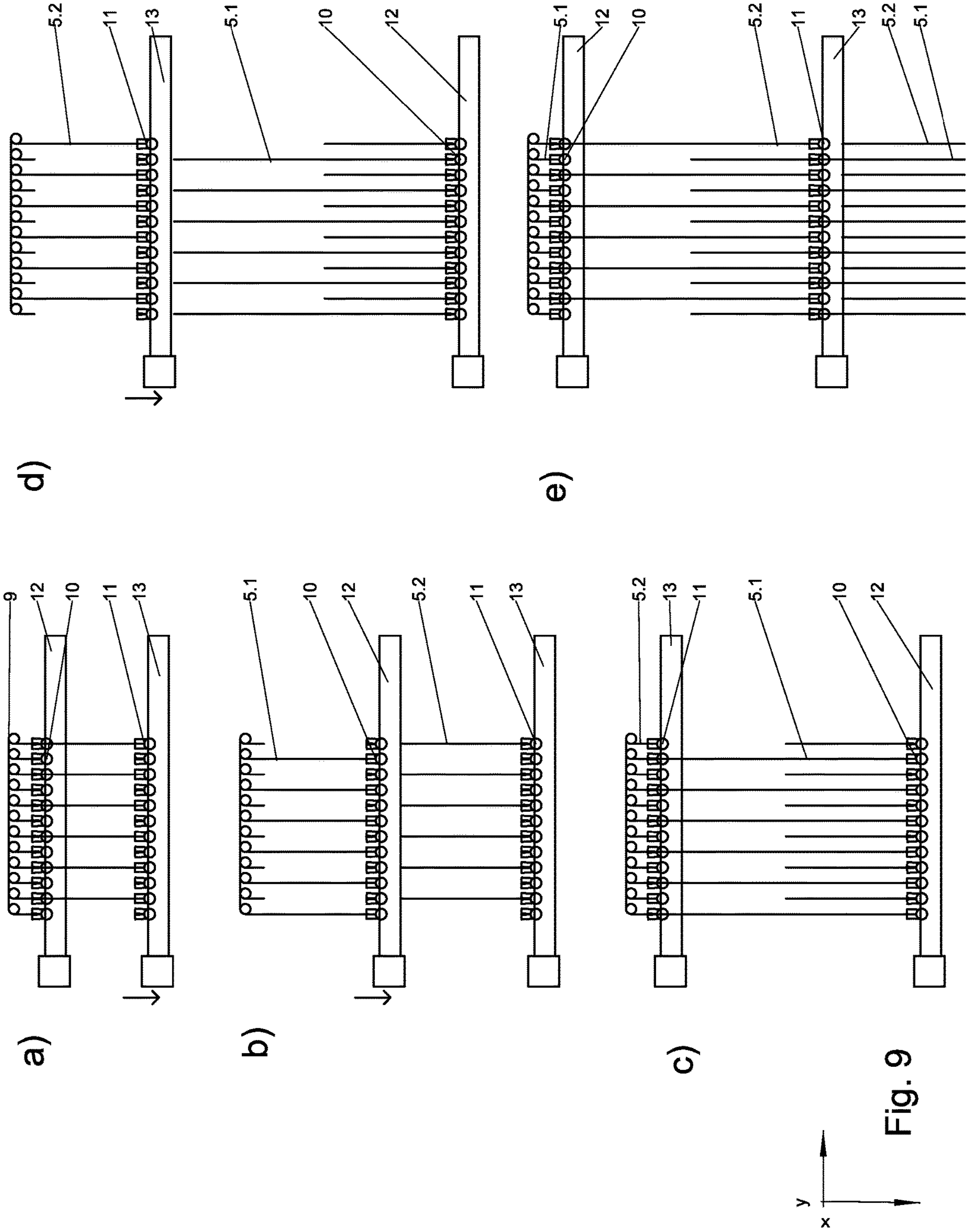
Figure 10:
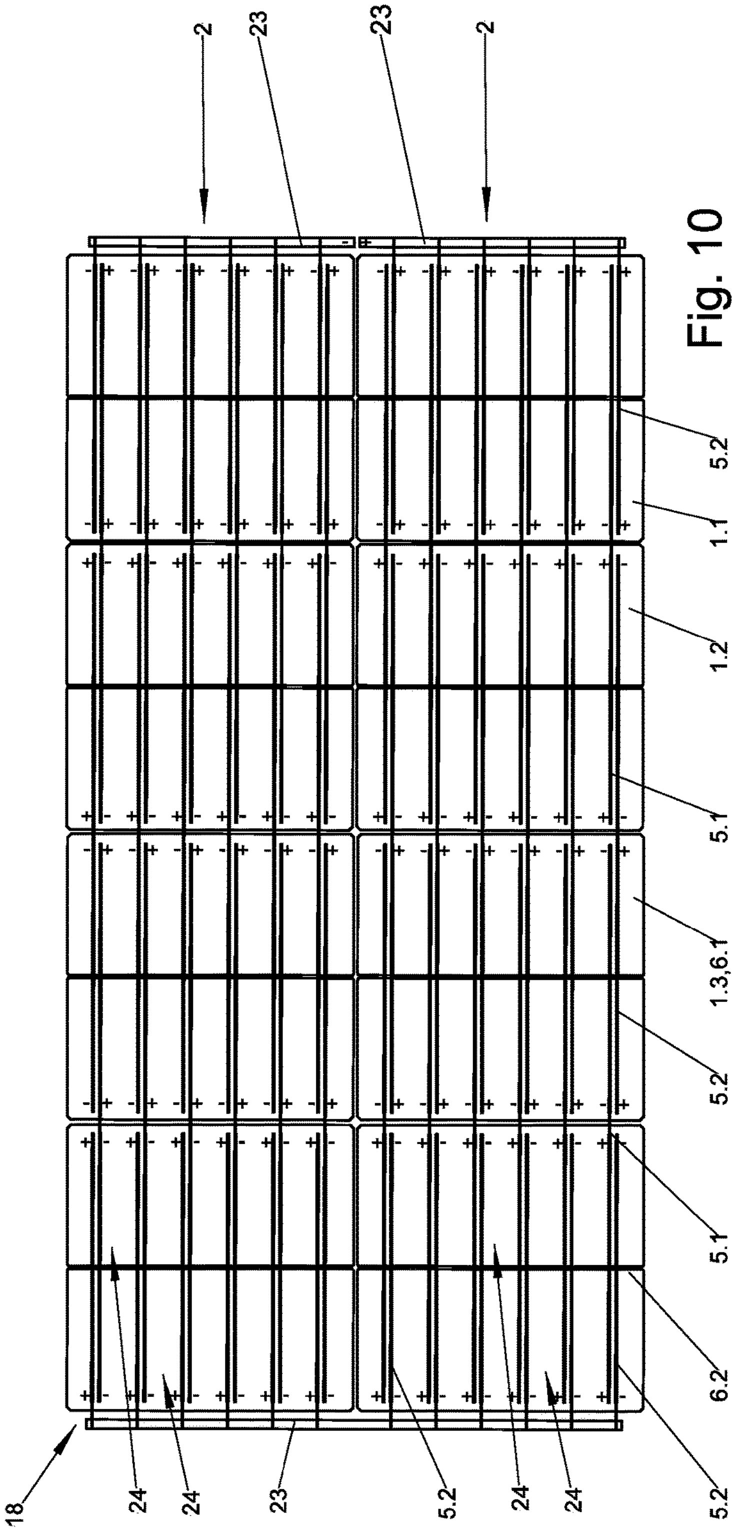

b) a second variation of a photovoltaic cell having back face main conductor paths;

FIG. 3 a first variation of a photovoltaic module according to the disclosure;

FIG. 4 *a*) to e) initial steps a first variation of a method according to the disclosure;

FIG. 5 *a*) to e) steps a first variation of a method according to the disclosure;

FIG. 6 *a*) to e) initial steps a second variation of a method according to the disclosure;

FIG. 7 *a*) to e) steps a first variation of a method according to the disclosure;

FIG. 8 *a*) to e) steps of a method according to the disclosure performed by the first variation of the device;

FIG. 9 *a*) to e) steps of a method according to the disclosure performed by a second variation of the device;

FIG. 10 a second variation of a photovoltaic module according to the disclosure;

FIG. 11 *a*) a third variation of a photovoltaic cell having back face main conductor paths; and b) a fourth variation of a photovoltaic cell having back face main conductor paths.

DESCRIPTION OF THE EMBODIMENTS

Reference will now be made in detail to certain embodiments, examples of which are illustrated in the accompanying drawings, in which some, but not all features are shown. Indeed, embodiments disclosed herein may be embodied in many different forms and should not be construed as limited to the embodiments set forth herein; rather, these embodiments are provided so that this disclosure will satisfy applicable legal requirements. Whenever possible, like reference numbers will be used to refer to like components or parts.

Figure 1:
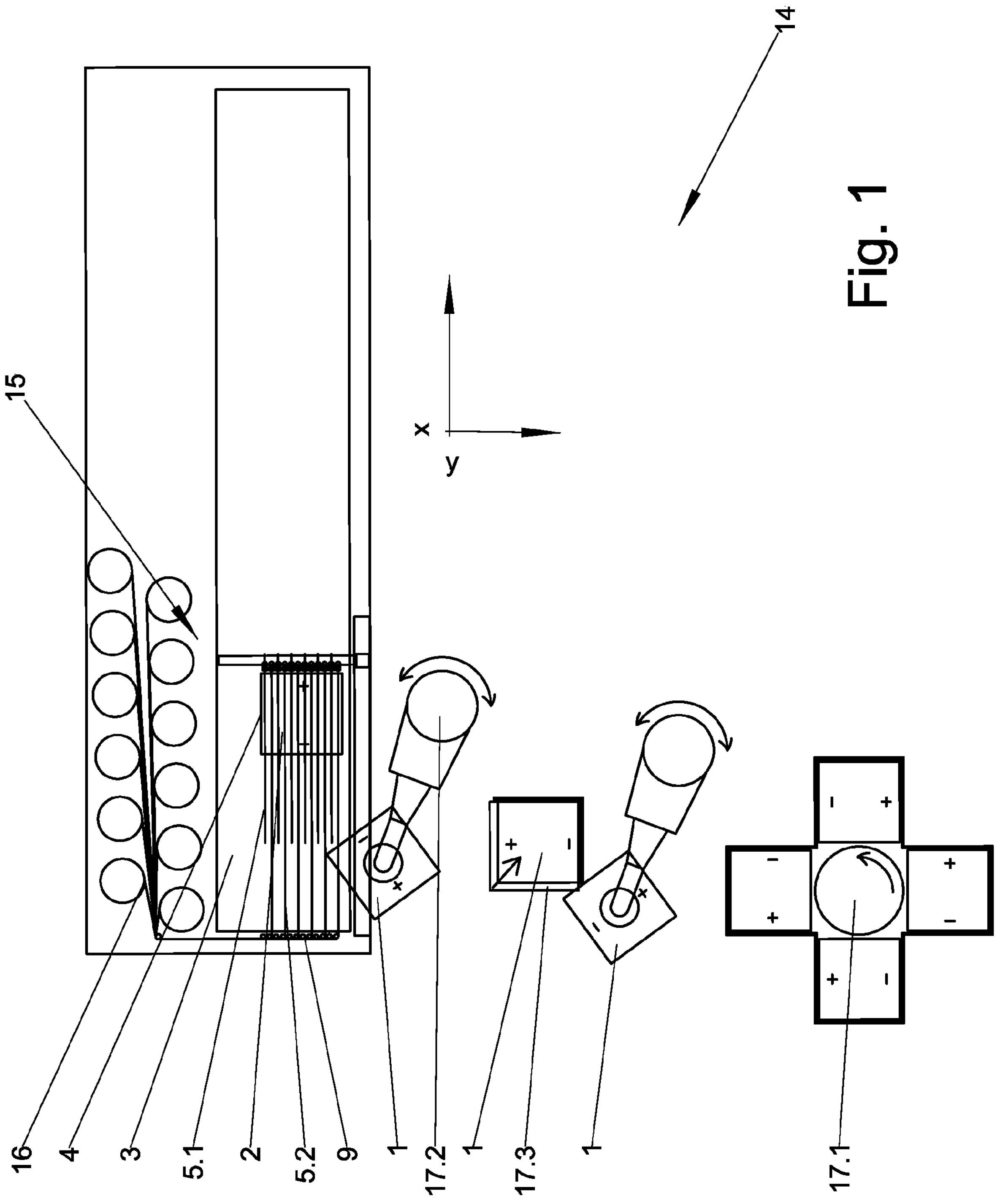
FIG. 1 a first variation of a device for wiring photovoltaic cells according to the disclosure.

FIG. 1 shows a first variation of a device 14 for wiring photovoltaic cells 1 according to the disclosure, while FIG. 2 *a*) and b) show a first and second variation of a photovoltaic cell 1 having back face main conductor paths 7. These photovoltaic cells 1 are electrically interconnected into strings 2 used to manufacture the first variation photovoltaic modules 18 according to the disclosure, as shown in FIG. 3. FIGS. 4 *a*) to e) and 5 *a*) to e) show steps of a first variation of a method according to the disclosure, whereas FIGS. 6 *a*) to e) and 7 *a*) to e) show steps a second variation of a method according to the disclosure. In FIGS. 8 *a*) to e) and 9 *a*) to e), a detailed view of a first and a second variation of a depositing means 8 is respectively shown performing steps of the method. FIG. 11 *a*) and b) show a third and fourth variation of a photovoltaic cell 1 having back face main conductor paths 7 and comprising two separate half-cells 24. These photovoltaic cells 1 are electrically interconnected into strings 2 used to manufacture photovoltaic modules 18 according to the disclosure, as shown in FIG. 10.

Visible in FIG. 1 is the device 14 for wiring photovoltaic cells 1 having back face main conductor paths 7 to a string 2 of photovoltaic cells 1. The device 14 typically comprises a platform 3 having a conveying means 3.1 for transporting in a first direction x photovoltaic cells 1 arranged thereon next to each other in the first direction x. The device 14 further comprises in the shown first variation an applicator 15 comprising a feeding means 9 and a depositing means 8.

For wiring the photovoltaic cells 1, the depositing means 8 is configured to deposit in a first lateral position (direction y) at least one elongated wiring element 5.1 from the feeding means 9 in the first direction x for electrically interconnecting a first photovoltaic cell 1.1 and a second photovoltaic cell 1.2 arranged next to each other in the first direction x on their back faces 4. In addition, the depositing means 8 is configured to deposit at least one elongated wiring element 5.2 in a second lateral position from the feeding means 9 in the first direction x for electrically interconnecting the second photovoltaic cell 1.2 and a third photovoltaic cell 1.3 arranged next to each other in the first direction x on their back faces 4. The elongated wiring element can be deposited directly on the platform or on the photovoltaic cells 1 arranged thereon.

As can be seen in FIG. 1, the device 14 may also comprise a supply arrangement 17 arranged next to the depositing means 8 being configured to supply photovoltaic cells 1 to the depositing means 8. The supply arrangement 17 comprises in the shown variation a depot 17.1 for storing photovoltaic cells 1, an alignment means 17.3 for aligning at least one photovoltaic cell 1 to a predefined position and an arrangement means 17.2 for arranging photovoltaic cells on the platform 3.

FIG. 2 shows two variations of photovoltaic cells 1 having main conductor paths 7 arranged on their back face 4. In FIG. 2 *a*) a first variation of photovoltaic cells is shown which comprises twelve main conductor paths 7 arranged essentially equidistant spaced apart from each other in the lateral direction y. Each main conductor path 7 essentially spans the total length of the back face 4 in the first direction x. In the shown variation, there are six positive main conductor paths 7.1 and six negative main conductor paths 7.2 arranged alternatingly. In the second variation shown in FIG. 2 *b*) the main conductor paths 7 are not arranged equidistant from each other in the lateral direction y. In both variations, the positive main conductor paths 7.1 are electrically connected to p-type semiconductor regions 19 each by several positive contact fingers 20. The negative main conductor paths 7.2 are electrically connected to n-type semiconductor regions 21 by several negative contact fingers 22 interdigitated with the positive contact fingers 20.

Figure 11A:
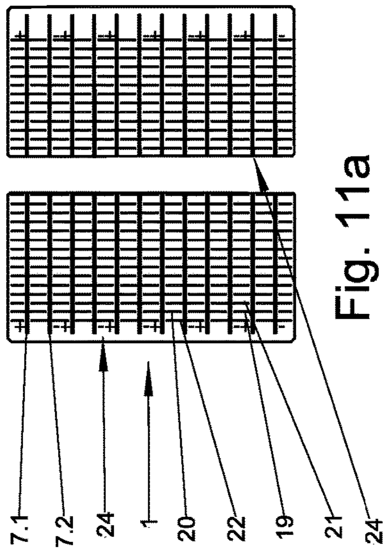
Figure 11B:
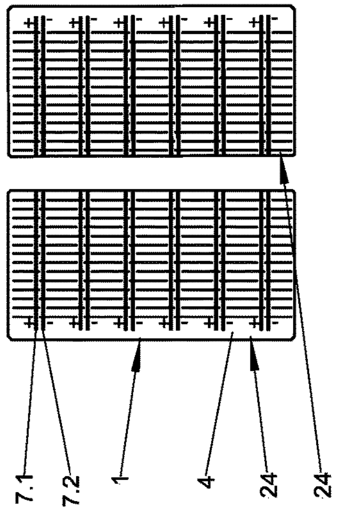

FIGS. 11*a* and 11*b* show similar photovoltaic cells 1, wherein the first variation shown in FIG. 2 *a*) corresponds to the third variation shown in FIG. 11*a* and the second variation shown in FIG. 2 *b*) corresponds to the fourth variation shown in FIG. 11*b*. However, the variations of the photovoltaic cells 1 shown in FIG. 11 each comprise two separate half-cells 24. Typically, such pairs of half-cells 24 are created by dividing a full photovoltaic cell 1 essentially perpendicular to its main conductor paths 7.1, 7.2 into two separate half-cells 24.

The first variation of the photovoltaic module 18 visible in FIG. 3 comprises two strings 2 of four photovoltaic cells 1 respectively. The strings 2 are electrically interconnected in series via a common end contact conductor 23 extending in the lateral direction y along respective end sections of the two strings 2. Within each string 2 every second photovoltaic cell 1 in the first direction x is turned by 180 degrees (i.e. a vertical axis of rotation, perpendicular to the first and the lateral direction x, y). This allows an essentially straight wiring of two neighboring photovoltaic cells 1 by elongated wiring elements 5.1, 5.2.

In contrast thereto the second variation of the photovoltaic module 18 visible in FIG. 10 comprises two strings 2 of four photovoltaic cells 1 respectively. Each of the photovoltaic cells 1 comprises two separate half-cells 24 which are arranged next to each other in the first direction x. Each half-cell 24 typically has about half the length in the first direction x and a similar width in the second direction y compared to a full photovoltaic cell 1.

In the first variation of a method according to disclosure, as shown in FIGS. 4 and 5, the elongated wiring elements 5.1 and 5.2 are deposited on the platform 3 and the photovoltaic cells 1.1, 1.2 are arranged by the supply arrangement 17 afterwards onto the platform 3 carrying the elongated wiring elements. Typically, a group of essentially parallel elongated wiring element 5.2, 5.1 is deposited on a conveying means 3.1 of the platform, then a subsequent photovoltaic cell is arranged thereon and finally the conveying means 3.1 moves in the first direction x about the length of one photovoltaic cell 1. This routine is repeated until the desired number on photovoltaic cells is interconnected.

The electrical interconnection of the elongated wiring elements 5 with the respective main conductor path can either be done directly on the platform 3 by adhesives applied to the elongated wiring elements 5 or by soldering.

In FIGS. 6 and 7 the sequence of the steps is swapped compared to FIGS. 4 and 5, in that the photovoltaic cells 1 are arranged first on the platform 3 and the elongated wiring elements 5.1, 5.2 are deposited thereon afterwards.

The depositing of elongated wiring elements 5.1, 5.2 is shown in FIGS. 8 and 9, wherein in FIG. 8 the depositing means 8 comprises a first gripper arm 12 arranged movable in the first direction above the platform 3. A group of first grippers 10 is arranged on the first gripper arm 12 alternating with a group of second grippers 11 on the first gripper arm 12. In order to deposit a group of elongated wiring elements 5.2 in the second lateral position as shown in FIG. 8 *a*) the first gripper arm 12 is moved to a position next to the feeding means 9, so that the second grippers 11 can respectively grip an end of the wiring material, by closing the respective second gripper 11. Thereafter the first gripper arm 12 is moved away from the feeding means 9 and thereby draws the wiring material from the feeding means 9. Before an intermediate terminal position in the first direction x of the first gripper arm is reached the wiring material is cut to length, such that elongated wiring elements 5,2 can be deposited by releasing the grip of the second grippers 11. Afterwards the conveying means 3, 1 advances in the first direction x by about the length in the first direction x of a photovoltaic cell 1. Next, as shown in FIG. 8 *b*), the first gripper arm 12 is moved back in the first direction to the feeding means 9, such that the first grippers 10 can grip the end of the wiring material. Afterwards the first gripper arm 12 is moved in the first direction x away from the feeding means 9, thereby drawing wiring material therefrom. In the next intermediate terminal position of the first gripper arm 12, as visible in FIG. 8 *c*), the first grippers 10 are releasing the drawn elongated wiring elements 5 in the first lateral position. Next the conveying means 3.1 are advanced in the first direction x.

This is repeated in FIGS. 8 *d*) and e) for depositing a group of parallel elongated wiring elements 5.2 in the second lateral position.

In contrast thereto, the second variation of the depositing means 8 comprises, as shown in FIGS. 9 *a*) to e), an additional second gripper arm 13, having arranged thereon the group of second grippers 11. This allows an independent movement of the group of first grippers 10 and the group of second grippers 11, allowing to deposit essentially simultaneously elongated wiring elements 5.1, 5.2 in the first and in the second lateral position.

Rather, the words used in the specification are words of description rather than limitation, and it is understood that various changes may be made without departing from the scope of the disclosure.

| LIST OF DESIGNATIONS | |
|---|---|
| 1 | Photovoltaic cell |
| 1.1 | First photovoltaic cell |
| 1.2 | Second photovoltaic cell |
| 1.3 | Third photovoltaic cell |
| 2 | String (of photovoltaic cells) |
| 3 | Platform |
| 3.1 | Conveying means |
| 4 | Back face |

-continued

| LIST OF DESIGNATIONS | |
|---|---|
| 5 | Elongated wiring element |
| 5.1 | Elongated wiring element in a first lateral position |
| 5.2 | Elongated wiring element in a second lateral position |
| 6 | Subsequent photovoltaic cell |
| 6.1 | First subsequent photovoltaic cell |
| 6.2 | Second subsequent photovoltaic cell |
| 7 | Main conductor path |
| 7.1 | Positive main conductor path |
| 7.2 | Negative main conductor path |
| 8 | Depositing means |
| 9 | Feeding means |
| 10 | First gripper |
| 11 | Second gripper |
| 12 | First gripper arm |
| 13 | Second gripper arm |
| 14 | Device |
| 15 | Applicator |
| 16 | Supply (of elongated wiring elements) |
| 17 | Supply arrangement (of photovoltaic cells) |
| 17.1 | Depot (of photovoltaic cells) |
| 17.2 | Arrangement means (robot) |
| 17.3 | Alignment means |
| 18 | Photovoltaic module |
| 19 | P-type semiconductor region |
| 20 | Positive contact finger |
| 21 | N-type semiconductor region |
| 22 | Negative contact finger |
| 23 | End contact conductor |
| 24 | Half-cell (of photovoltaic cell) |

The invention claimed is:

1. A method for wiring photovoltaic cells to a string of electrically interconnected photovoltaic cells, the method comprising the following steps:

a. arranging next to each other in a first direction a first, a second and a third photovoltaic cell on a platform, wherein the second photovoltaic cell is arranged between the first and the third photovoltaic cell in a rotated orientation with respect to the first and the third photovoltaic cell;

b. electrically interconnecting the first photovoltaic cell and the second photovoltaic cell on their respective back faces in series by at least one elongated wiring element in the first direction in a first lateral position;

c. electrically interconnecting the second photovoltaic cell and the third photovoltaic cell on their respective back faces in series by at least one elongated wiring element in the first direction in a second lateral position; wherein d. the first and the second lateral positions are off-set with respect to each other perpendicular to the first direction;

e. wherein the at least one elongated wiring element is drawn by a depositing means in the first direction from a feeding means, the depositing means are thereby moving relative to the platform; and f. wherein the at least one elongated wiring element is cut during depositing to a length of less than two photovoltaic cells in the first direction arranged next to each other in the first direction.

2. The method according to claim 1, wherein the method comprises the steps:

a. arranging a first subsequent photovoltaic cell on the platform in the first direction next to a photovoltaic cell momentarily tailing the string and electrically interconnecting the first subsequent photovoltaic cell and the photovoltaic cell momentarily tailing the string on their respective back faces in series by at least one elongated wiring element in the first direction in the first lateral position; and/or b. arranging a second subsequent photovoltaic cell on the platform in the first direction next to a photovoltaic cell momentarily tailing the string and electrically interconnecting the second subsequent photovoltaic cell and the photovoltaic cell momentarily tailing the string on their respective back faces in series by at least one elongated wiring element in the first direction in the second lateral position.

3. The method according to claim 1, wherein the first and/or the second subsequent photovoltaic cell are respectively arranged with a rotated orientation next to the photovoltaic cell momentarily tailing the string, such that at least one main conductor path of the first or the second subsequent photovoltaic cell is aligned in the first direction with a main conductor path of opposite polarity of the photovoltaic cell momentarily tailing the string.

4. The method according to claim 1, wherein the method comprises depositing at least one elongated wiring element in the first direction in the first or in the second lateral position onto the platform.

5. The method according to claim 1, wherein the method comprises:

a. gripping by at least one first gripper arranged in the first lateral position on a first gripper arm at least one elongated wiring element for depositing the at least one elongated wiring element in the first lateral position; and b. gripping by at least a second gripper arranged in the second lateral position on the first gripper arm or a separate second gripper arm at least one elongated wiring element for depositing the at least one elongated wiring element in the second lateral position.

6. The method according to claim 5, wherein the at least one first gripper acts as the at least one second gripper by switching between the first to the second lateral position.

7. The method according to claim 1, wherein only a first and a second photovoltaic cell are arranged on the platform and the method comprising the steps of:

a. electrically contacting the first photovoltaic cell by at least one elongated wiring element in the first direction in the second lateral position; and b. electrically interconnecting the first photovoltaic cell and the second photovoltaic cell on their respective back faces in series by at least one elongated wiring element in the first direction in the first lateral position.

8. The method according to claim 1, wherein at least one of the photovoltaic cells, in particular the first and/or the second and/or the third photovoltaic cell, comprises two separate half-cells which are arranged next to each other in the first direction.

* * * * *